(12) United States Patent
Furukawa et al.

(10) Patent No.: US 8,564,180 B2
(45) Date of Patent: Oct. 22, 2013

(54) PIEZOELECTRIC COMPOSITION, PIEZOELECTRIC CERAMIC, TRANSDUCER, AND ULTRASONIC MOTOR

(75) Inventors: Masahito Furukawa, Tokyo (JP); Daisuke Tanaka, Tokyo (JP); Tadashi Takenaka, Chiba (JP); Hajime Nagata, Chiba (JP); Yuji Hiruma, Christchurch (NZ)

(73) Assignee: TDK Corporation, Tokyo (JP)

( * ) Notice: Subject to any disclaimer, the term of this patent is extended or adjusted under 35 U.S.C. 154(b) by 412 days.

(21) Appl. No.: 13/038,814

(22) Filed: Mar. 2, 2011

(65) Prior Publication Data

US 2011/0241483 A1  Oct. 6, 2011

(30) Foreign Application Priority Data

Mar. 31, 2010  (JP) ................. 2010-082909

(51) Int. Cl.
*H01L 41/187* (2006.01)

(52) U.S. Cl.
CPC .................. *H01L 41/1871* (2013.01)
USPC ................... 310/358; 252/62.9 PZ

(58) Field of Classification Search
CPC .................................. H01L 41/1871
USPC .................... 310/358; 252/62.9 PZ
See application file for complete search history.

(56) References Cited

U.S. PATENT DOCUMENTS

| | | | |
|---|---|---|---|
| 5,607,614 A | | 3/1997 | Kawano et al. |
| 5,945,030 A * | | 8/1999 | Kimura et al. ........... 252/62.9 R |
| 6,117,354 A * | | 9/2000 | Kimura et al. ........... 252/62.9 R |
| 6,258,291 B1 * | | 7/2001 | Kimura et al. ........... 252/62.9 R |
| 6,558,567 B2 * | | 5/2003 | Kimura et al. ......... 252/62.9 PZ |
| 7,390,426 B2 * | | 6/2008 | Tsukada et al. .......... 252/62.9 R |
| 7,510,669 B2 * | | 3/2009 | Ogawa et al. ............ 252/62.9 R |
| 7,525,239 B2 * | | 4/2009 | Aoki et al. ..................... 310/358 |
| 7,646,140 B2 * | | 1/2010 | Aoki et al. ..................... 310/358 |
| 7,754,095 B2 * | | 7/2010 | Kawada et al. .......... 252/62.9 R |
| 7,901,590 B2 * | | 3/2011 | Tsukada et al. .......... 252/62.9 R |
| 7,910,016 B2 * | | 3/2011 | Kawada et al. .......... 252/62.9 R |
| 8,043,987 B2 * | | 10/2011 | Chen et al. ..................... 501/136 |
| 8,258,679 B2 * | | 9/2012 | Fukuoka ....................... 310/358 |
| 2003/0100436 A1 * | | 5/2003 | Takahashi ..................... 501/134 |
| 2009/0302961 A1 | | 12/2009 | Ogawa et al. |
| 2010/0133959 A1 * | | 6/2010 | Yamazaki et al. ............ 310/365 |
| 2011/0133608 A1 * | | 6/2011 | Fukuoka ....................... 310/365 |
| 2011/0241483 A1 * | | 10/2011 | Furukawa et al. ....... 310/323.02 |

FOREIGN PATENT DOCUMENTS

| | | |
|---|---|---|
| JP | B2 3785648 | 9/1995 |
| JP | A 2003-055048 | 2/2003 |
| WO | WO 2008/090758 A1 | 7/2008 |

OTHER PUBLICATIONS

Kawada et al., "Relationship between Vibration Detection and High-Power Characteristics of {001}—Textured $SrBi_2Nb_2O_9$ Ceramics," Japanese Journal of Applied Physics, vol. 46, No. 10B, Oct. 22, 2007, pp. 7079-7083.

Ogawa et al., "High-Powered Piezoelectric Characteristics of Textured Bismuth Layer Structured Ferroelectric Ceramics," IEEE Transactions on Ultrasonics, Ferroelectrics, and Frequency Control, vol. 54, No. 12, Dec. 2007, pp. 2500-2504.

* cited by examiner

*Primary Examiner* — Jaydi San Martin
(74) *Attorney, Agent, or Firm* — Oliff and Berridge, PLC

(57) ABSTRACT

A piezoelectric composition includes a compound represented by a general expression $Bi_4Ti_3O_{12}$—$SrBi_4Ti_4O_{15}$ as a main component; and Mn or a Mn compound as an additive. A Mn content is less than 1.0% by mass based on a main component amount.

5 Claims, 2 Drawing Sheets

PIEZOELECTRIC COMPOSITION, PIEZOELECTRIC CERAMIC, TRANSDUCER, AND ULTRASONIC MOTOR

CROSS-REFERENCE TO RELATED APPLICATIONS

This application is based upon and claims the benefit of priority from Japanese Patent Application No. 2010-082909, filed on Mar. 31, 2010, the entire contents of which are incorporated herein by reference.

BACKGROUND OF THE INVENTION

1. Field of the Invention

The present invention relates to a piezoelectric composition, a piezoelectric ceramic manufactured by using the piezoelectric composition, a transducer, and an ultrasonic motor.

2. Description of the Related Art

A piezoelectric ceramic used in an ultrasonic motor, an ultrasonic cleaner, a piezoelectric transformer, and the like, and a piezoelectric ceramic used in an actuator that utilizes a resonance displacement are required to have a large resonance displacement and an excellent piezoelectric property. Specially, when the piezoelectric ceramic is used in the ultrasonic motor or the like, a drive frequency becomes high, so that a low mechanical quality factor (Qm) of the piezoelectric ceramic leads to easy heat generation, which may cause depolarization, change in piezoelectric constant, or the like. Thus, the piezoelectric ceramic having a high mechanical quality factor (Qm) is required.

In the piezoelectric ceramic that satisfies such property, a PZT ($PbZrO_3$—$PbTiO_3$ solid solution) based and a PT ($PbTiO_3$) based perovskite-type compound, and the like are used (see Japanese Patent No. 3785648). However, these compounds include Pb, which leads to environmental concerns. Therefore, a Pb-free compound has been variously studied.

For example, the piezoelectric ceramic using a $BaTiO_3$ based compound or a KNN ($KNbO_3$—$NaNbO_3$ solid solution) based compound is proposed (see Japanese Laid-open Patent Publication No. 2003-055048). Moreover, a resonant actuator that exerts an excellent mechanical quality factor (Qm) by orienting crystals of a bismuth layer compound is also proposed (see Shinichiro KAWADA, Hirozumi OGAWA, Masahiko KIMURA, Kosuke SHIRATSUYU, and Yukio HIGUCHI, "Relationship between Vibration Direction and High-Power Characteristics of h001i-Textured SrBi2Nb2O9 Ceramics", *Japanese Journal of Applied Physics*, Vol. 46, No. 10B, 2007, pp. 7079-7083 (hereinafter, "Kawada") and Hirozumi Ogawa, Shinichiro Kawada, Masahiko Kimura, Kousuke Shiratsuyu, and Yukio Sakabe, "High-Power Piezoelectric Characteristics of Textured Bismuth Layer Structured Ferroelectric Ceramics", *IEEE transactions on ultrasonics, ferroelectrics, and frequency control*, vol. 54, no. 12, December 2007, pp. 2500-2504 (hereinafter, "Ogawa")).

However, the piezoelectric ceramic using a $BaTiO_3$ based compound disclosed in Japanese Laid-open Patent Publication No. 2003-055048 has a low mechanical quality factor (Qm) compared with the piezoelectric ceramic using PZT-based and PT-based compounds. Therefore, this may not be suitable for the above use such as the ultrasonic motor. Moreover, the piezoelectric ceramic using a KNN-based compound disclosed in Japanese Laid-open Patent Publication No. 2003-055048 includes Nb in a raw material, so that a material cost is relatively high, and moreover, alkali metal such as K and Na is used, so that deviation of composition when firing is easy to occur and a sufficient moisture resistance may not be obtained.

Furthermore, a piezoelectric ceramic disclosed in International Publication No. WO2008/090758 may not sufficiently suppress self-heating when driving even if the mechanical quality factor (Qm) is made sufficiently high, whereby the piezoelectric property changes in some cases. Moreover, in the piezoelectric ceramics disclosed in Kawada and Ogawa, a high mechanical quality factor (Qm) is obtained by crystallographically orienting a bismuth layer component; however, many processes are needed for crystallographically orienting the bismuth layer component, therefore having a problem in cost and the like for industrially manufacturing it.

SUMMARY OF THE INVENTION

A piezoelectric composition according to an aspect of the present invention includes a compound represented by a general expression $Bi_4Ti_3O_{12}$—$SrBi_4Ti_4O_{15}$ as a main component; and Mn or a Mn compound as an additive. A Mn content is less than 1.0% by mass based on a main component amount.

A piezoelectric ceramic according to another aspect of the present invention is manufactured by using the piezoelectric composition according to the present invention and has a mechanical quality factor of 1000 or more.

A transducer according to still another aspect of the present invention includes the piezoelectric ceramic according to the present invention; and an electrode.

An ultrasonic motor according to still another aspect of the present invention includes the transducer according to the present invention.

The above and other objects, features, advantages and technical and industrial significance of this invention will be better understood by reading the following detailed description of presently preferred embodiments of the invention, when considered in connection with the accompanying drawings.

DETAILED DESCRIPTION OF THE PREFERRED EMBODIMENTS

Figure 1:
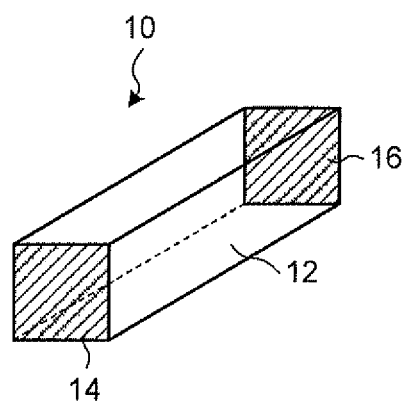
FIG. 1 is a perspective view illustrating an example of a transducer in an embodiment.

The inventors enthusiastically studied the piezoelectric composition that is excellent in the piezoelectric property and generates little heat when driving, on the premise of giving consideration to environmental problems by sufficiently reducing the Pb content. Consequently, the inventors found that it is possible to obtain a composition that is suitable for manufacturing the piezoelectric ceramic that can obtain an excellent mechanical quality factor (Qm) and exert fine vibration speed and resonance frequency variation by regulating a composition of a main component and an additive amount. Details of such findings are as follows.

Bismuth layer-structured ferroelectrics (BLSF) have a structure in which a pseudo-perovskite block is sandwiched between $Bi_2O_2$ layers and an oxygen octahedron of the pseudo-perovskite block tilts. Therefore, the BLSF shows a high coercive field Ec compared with perovskite-type ferroelectrics. Thus, a domain wall of the BLSF does not easily move, so that the mechanical quality factor (Qm) of the BLSF is typically large compared with a dielectric of the perovskite structure.

However, because the domain wall of the BLSF does not easily move, a polarization treatment needed for giving the piezoelectric property is difficult to perform, so that the BLSF is disadvantageous in terms of the polarization treatment compared with the dielectric of the perovskite structure.

In view of the above, the inventors found that it is possible to obtain a composition with which a piezoelectric ceramic capable of reducing heat generation when driving by having an excellent mechanical quality factor (Qm) and by showing a relatively high vibration speed and enabling to reduce a resonance frequency variation at a high level due to easy polarization inversion, i.e., by having an excellent piezoelectric property, through addition of Mn to the BLSF. The present invention is completed based on the above findings.

An exemplary embodiment according to the present invention will be explained in detail below with reference to the drawings. The present invention is not limited to the embodiment. The components in the following explanation include ones that those skilled in the art would easily think of, and ones that are substantially the same, i.e., ones in a range of equivalency. The configurations disclosed in the following can be appropriately combined.

Piezoelectric Composition

The piezoelectric composition in the present embodiment includes a compound represented by a general expression: $Bi_4Ti_3O_{12}$—$SrBi_4Ti_4O_{15}$ as a main component and includes Mn or a Mn compound as an additive, in which the Mn content is less than 1.0% by mass based on the main component amount.

The composition represented by the above general expression is a complex bismuth layer compound and has a structure in which a pseudo-perovskite block is sandwiched between $Bi_2O_2$ layers and an oxygen octahedron of the pseudo-perovskite block tilts. The composition has a structure in which part of B site in a plurality of layers of $A_xB_yO_z$ (A is Bi or Sr, B is Ti, X is 2 or 3, Y is 3 or 4, and Z is 10 or 13) forming the pseudo-perovskite block is substituted with Mn. Alternatively, the composition has a structure in which the Mn compound is segregated at a crystal grain boundary of the main component.

A piezoelectric ceramic in which this composition is used has a piezoelectric strain constant higher than that of a piezoelectric ceramic in which a single composition of $Bi_4Ti_3O_{12}$ or $SrBi_4Ti_4O_{15}$ is used and has an excellent mechanical quality factor (Qm) at room temperature. In the piezoelectric ceramic in which this composition is used, a speed when vibrating is fast and a resonance frequency variation is small, so that the piezoelectric ceramic is a piezoelectric ceramic that generates little heat when driving. Therefore, in the present embodiment, an excellent mechanical quality factor (Qm) in the piezoelectric ceramic means that the piezoelectric strain constant is high, the speed when vibrating is high, the resonance frequency variation is small, and the like, i.e. a piezoelectric property is high.

This composition includes a compound represented by a general expression: $Bi_4Ti_3O_{12}$—$SrBi_4Ti_4O_{15}$ as the main component. The content of the main component is preferably 90% by mass or more, more preferably 95% by mass or more, and even more preferably 98% by mass or more, based on the whole composition.

This composition includes Mn or a Mn compound as the additive. The Mn content is less than 1.0% by mass based on the main component amount in any of the case of a single Mn and the case of a Mn compound. Because the composition includes Mn or a Mn compound as the additive, an excellent mechanical quality factor (Qm) of the piezoelectric ceramic is realized, whereby heat generation when driving is sufficiently reduced. The Mn content is preferably 0.2% by mass or more and 0.8% by mass or less.

This composition can include lead (Pb); however, as described above, the content thereof is preferably 1% by mass or less based on $Bi_4Ti_3O_{12}$—$SrBi_4Ti_4O_{15}$, and the composition more preferably includes no lead. The piezoelectric ceramic that can be obtained by using the composition in which the content of lead is sufficiently reduced can minimize vaporization of lead when firing and release of lead to the environment after being distributed in the market as a piezoelectric component such as a piezoelectric element and is disposed.

The piezoelectric composition in the present embodiment can be manufactured as follows. Specifically, first, as a raw material to be the main component, oxide powders that include bismuth, titanium, and strontium, respectively, are prepared. Moreover, as a raw material to be the additive, an oxide powder that includes manganese is prepared. Furthermore, an oxide powder that includes barium as a raw material of a substituted component is prepared as needed. Conventional marketed products can be used for these powders and these powders can be mixed by a known method. As the row materials of the main component, the additive, and the substituted component, it is applicable to use one that becomes an oxide by firing such as carbonate or oxalate instead of an oxide.

In any of the case of following $Bi_4Ti_3O_{12}$—$SrBi_4Ti_4O_{15}$ and the case of substituting part of $SrBi_4Ti_4O_{15}$ with $BaBi_4Ti_4O_{15}$, these raw materials are weighed to a ratio to be a predetermined composition. When adding the additive (Mn), the additive is weighed to be a predetermined ratio (less than 1.0% by mass) with respect to the whole main component. The weighed raw materials are sufficiently mixed in an organic solvent or water by using a ball mill or the like. The composition of the piezoelectric composition can be adjusted by changing the mixture ratio of the raw materials.

Next, the mixture mixed by the above method is dried, formed by pressing, and calcined at 700° C. or more and 1000° C. or less for one hour or more and less than five hours to obtain the calcinated bodies. The calcinated bodies are sufficiently comminuted in an organic solvent or water by a ball mill or the like and dried. Then, a binder is added to be granulated, whereby the piezoelectric composition in the present embodiment is obtained. The composition of the obtained composition can be analyzed by an X-ray diffraction or an inductively coupled plasma optical emission spectroscopy (ICP).

Piezoelectric Ceramic

The piezoelectric ceramic in the present embodiment is manufactured by using the composition as described above and therefore is a piezoelectric ceramic that generates little heat when driving due to exertion of an excellent mechanical quality factor (Qm), a high speed when vibrating, and a small resonance frequency variation, i.e., an excellent piezoelectric property. The piezoelectric ceramic in the present embodiment is manufactured, for example, as follows.

Specifically, the above described powdery piezoelectric composition is subject to press forming by using a uniaxial press machine or a cold isostatic press (CTP) machine to obtain a compact. This compact is heated to be debinded, and is sintered at 1150° C. or more and 1200° C. or less for one hour or more to five hours or less to obtain a sintered body for the piezoelectric ceramic. The sintering can be performed in air. The sintered body can be processed to a predetermined shape as appropriate. Finally, with a method of applying a predetermined electric field, the sintered body is subjected to a polarization treatment. Consequently, the piezoelectric ceramic in the present embodiment is obtained.

This piezoelectric ceramic preferably has a relative density of 95% or more. With such high relative density, a further excellent piezoelectric property (speed when vibrating or resonance frequency variation) can be obtained. The relative density of the piezoelectric ceramic can be measured by the Archimedes' method. The relative density of the piezoelectric ceramic can be adjusted by changing a sintering temperature or a sintering time.

Transducer

The transducer in the embodiment is obtained by using the above piezoelectric ceramic. Two types of transducers are explained as examples thereof.

FIG. 1 is a perspective view illustrating an example of the transducer in the present embodiment. As shown in FIG. 1, a transducer 10 includes a piezoelectric ceramic 12 and a pair of electrodes 14 and 16 provided to sandwich the piezoelectric ceramic 12 at opposing surfaces in the longitudinal direction thereof. The electrodes 14 and 16 can be formed by metal such as gold (Au) and silver (Ag), and can be provided by applying and baking a paste of the metal. The electrodes 14 and 16 can be electrically connected to an external power supply via a conductive wire such as a wire.

The piezoelectric ceramic 12 is polarized in a direction (longitudinal direction of the piezoelectric ceramic 12 in FIG. 1) in which the pair of electrodes 14 and 16 are opposed to each other, and when a voltage is applied via the electrodes 14 and 16, the transducer 10 vibrates in the longitudinal direction thereof. The piezoelectric ceramic 12 is manufactured by using the above composition and therefore has an excellent mechanical quality factor (Qm), in other words, an excellent piezoelectric property, so that the piezoelectric ceramic 12 is a ceramic with which heat generation when driving is sufficiently reduced.

Figure 2:
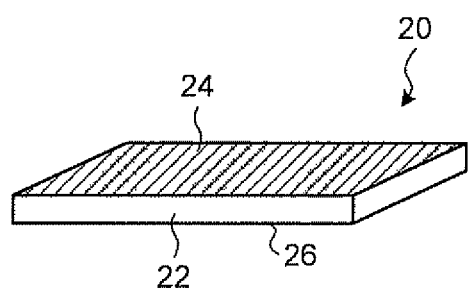
FIG. 2 is a perspective view illustrating another example of the transducer in the embodiment.

FIG. 2 is a perspective view illustrating another example of the transducer in the embodiment. As shown in FIG. 2, a transducer 20 includes a piezoelectric ceramic 22 and a pair of electrodes 24 and 26 provided to sandwich the piezoelectric ceramic 22 at opposing surfaces in the thickness direction thereof. The electrodes 24 and 26 can be formed by metal such as gold (Au) and silver (Ag), and can be provided by applying and baking a paste of the metal. The electrodes 24 and 26 can be electrically connected to an external power supply via a conductive wire such as a wire.

The piezoelectric ceramic 22 is polarized in a direction (thickness direction of the piezoelectric ceramic 22 in FIG. 2) in which the pair of electrodes 24 and 26 are opposed to each other, and when a voltage is applied via the electrodes 24 and 26, the transducer 20 vibrates in the long side direction thereof. In the similar manner to the piezoelectric ceramic 12 shown in FIG. 1, the piezoelectric ceramic 22 is manufactured by using the above composition and therefore has an excellent mechanical quality factor (Qm), in other words, an excellent piezoelectric property, so that the piezoelectric ceramic 22 is a ceramic with which heat generation when driving can be sufficiently reduced.

Ultrasonic Motor

Figure 3:
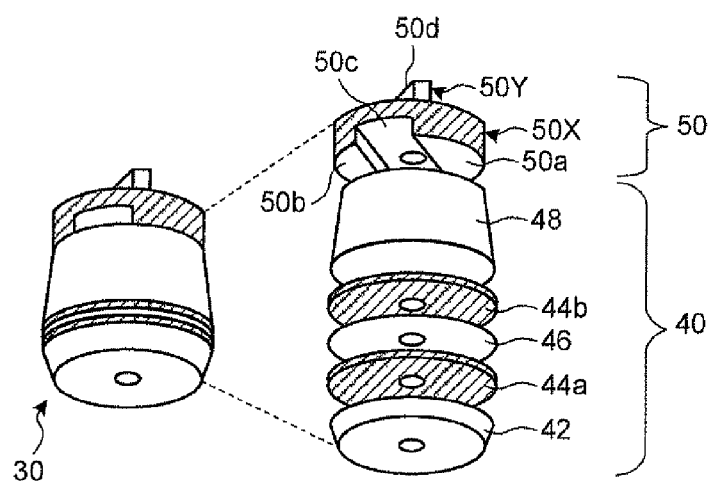
FIG. 3 is a perspective view illustrating an example of an ultrasonic motor in the present embodiment and an exploded perspective view thereof.

FIG. 3 is a perspective view illustrating an example of the ultrasonic motor in the embodiment and an exploded perspective view thereof. An ultrasonic motor 30 is obtained by using the above transducer. The ultrasonic motor 30 includes a Langevin transducer portion 40 and a torsion connector 50 that is connected to the Langevin transducer portion 40. The Langevin transducer portion 40 includes an aluminum cylinder 42, transducers 44a and 44b, a spacer 46, and an aluminum horn 48, and is formed by connecting them in order as shown in FIG. 3.

The torsion connector 50 includes a body 50X and a pinch portion 50Y formed on the upper portion of the body 50X, and the body 50X includes a pair of foot portions 50a and 50b that are defined by arcs and straight lines in a bottom view and a notch portion 50c that is approximately rectangular in the same view is formed between these foot portions 50a and 50b. The pinch portion 50Y is formed to tilt so that the longitudinal direction thereof does not coincide with the longitudinal direction of the notch portion 50c. In FIG. 3, an opening formed in the center of each of the Langevin transducer portion 40 and the torsion connector 50 is an opening for passing a shaft therethrough when actually using the ultrasonic motor 30.

When the two foot portions 50a and 50b receive a longitudinal vibration generated from the Langevin transducer portion 40, a flexural vibration is excited in the bottom surface of the notch portion 50c. The pinch portion 50Y is provided such that the longitudinal direction thereof tilts with respect to the longitudinal direction of the notch portion 50c, so that a torsional vibration of the pinch portion 50Y is excited by the flexural vibration of the bottom surface of the notch portion 50c. Combination of the torsional vibration and the flexural vibration causes an elliptic motion at an upper end surface portion 50d of the pinch portion 50Y.

While in actual use, the ultrasonic motor 30 is used in a state of being bolted to a predetermined case, so that a rotor is held via the case and whereby a rotor holding force increases, thereby exerting a high torque and a high efficiency. The transducers 44a and 44b that are components of the ultrasonic motor 30 include the piezoelectric ceramic obtained by using the above composition and therefore has an excellent mechanical quality factor (Qm), i.e., an excellent piezoelectric property, so that heat generation when driving can be sufficiently reduced. Consequently, the ultrasonic motor 30 can produce a sufficiently high output.

Evaluation

Transducers according to the embodiment and comparative examples were produced and evaluated. The transducers according to the embodiment correspond to examples. The comparative examples do not indicate a conventional example.

Production of Transducer

Examples 1 to 5 and Comparative Examples 1 to 4

As a starting material, each powder raw material of commercially available bismuth oxide ($Bi_2O_3$), titanium oxide ($TiO_2$), strontium carbonate ($SrCO_3$), and manganese carbonate ($MnCO_3$) was prepared. Each of these powder raw materials was weighed to have a composition shown in Table 1. The additive amount of Mn is based on the main component amount.

TABLE 1

|  | Main Component Composition | Mn Additive Amount (% by mass) |
| --- | --- | --- |
| Example 1 | $Bi_4Ti_3O_{12}$—$SrBi_4Ti_4O_{15}$ | 0.2 |
| Example 2 | $Bi_4Ti_3O_{12}$—$SrBi_4Ti_4O_{15}$ | 0.4 |
| Example 3 | $Bi_4Ti_3O_{12}$—$SrBi_4Ti_4O_{15}$ | 0.5 |
| Example 4 | $Bi_4Ti_3O_{12}$—$SrBi_4Ti_4O_{15}$ | 0.6 |
| Example 5 | $Bi_4Ti_3O_{12}$—$SrBi_4Ti_4O_{15}$ | 0.8 |
| Comparative Example 1 | $Bi_4Ti_3O_{12}$ | 0.0 |
| Comparative Example 2 | $SrBi_4Ti_4O_{15}$ | 0.0 |
| Comparative Example 3 | $Bi_4Ti_3O_{12}$—$SrBi_4Ti_4O_{15}$ | 0.0 |
| Comparative Example 4 | $Bi_4Ti_3O_{12}$—$SrBi_4Ti_4O_{15}$ | 1.0 |

Ethyl alcohol was added to each of the weighed powder raw materials and a ball mill mixing was performed for ten hours using zirconia balls. After slurry obtained by the ball mill mixing was dried sufficiently, a press forming was performed and calcination was performed at 850° C. for two hours.

The piezoelectric composition obtained by the calcination was milled by a ball mill and dried, and about 10 g thereof was put into a metal mold having a diameter of 20 mm. Then, after press forming at a pressure of 100 MPa by using a uniaxial press machine, a final forming was performed at a pressure of 150 MPa by using a CIP. A compact was sintered at 1150° C. or more and 1200° C. or less for two hours to obtain the piezoelectric ceramic.

After the sintered body was sliced to a thickness of 2 mm, this was cut into a predetermined size (depth×width× height=2 mm×2 mm×5 mm), and a commercially available Ag paste was applied to both end portions thereof as an electrode and baking was performed at 500° C. Thereafter, an electric field of 4 kV/mm or more and 7.5 kV/mm or less was applied for seven minutes in silicone oil of 200° C. or more and 280° C. or less to perform the polarization treatment on the sintered body, thereby obtaining the transducers in Examples 1 to 5 and Comparative Examples 1 to 4.

Examples 6 and 7 and Comparative Examples 5 and 6

As a starting material, each powder raw material of commercially available bismuth oxide ($Bi_2O_3$), titanium oxide ($TiO_2$), strontium carbonate ($SrCO_3$), barium carbonate ($BaCO_3$), calcium carbonate ($CaCO_3$), and manganese carbonate ($MnCO_3$) was prepared. Each of these powder raw materials was weighed to have a composition shown in Table 2. The additive amount of Mn is based on the main component amount.

TABLE 2

|  | Main Component Composition | Mn Additive Amount (% by mass) |
| --- | --- | --- |
| Example 6 | $Bi_4Ti_3O_{12}$—$SrBi_4Ti_4O_{15}$ (20 mol % of $SrBi_4Ti_4O_{15}$ is substituted with $BaBi_4Ti_4O_{15}$) | 0.2 |
| Example 7 | $Bi_4Ti_3O_{12}$—$SrBi_4Ti_4O_{15}$ (40 mol % of $SrBi_4Ti_4O_{15}$ is substituted with $BaBi_4Ti_4O_{15}$) | 0.2 |
| Comparative Example 5 | $Bi_4Ti_3O_{12}$—$SrBi_4Ti_4O_{15}$ (60 mol % of $SrBi_4T_{14}O_{15}$ is substituted with $BaBi_4Ti_4O_{15}$) | 0.2 |
| Comparative Example 6 | $Bi_4Ti_3O_{12}$—$SrBi_4Ti_4O_{15}$ (20 mol % of $SrBi_4Ti_4O_{15}$ is substituted with $CaBi_4Ti_4O_{15}$) | 0.2 |

Ethyl alcohol was added to each of the weighed powder raw materials and a ball mill mixing was performed for ten hours using zirconia balls. In the similar manner to Examples 1 to 5 and Comparative Examples 1 to 4, a compact and a sintered body were produced in order and an electrode was applied, thereby obtaining the transducers in Examples 6 and 7 and Comparative Examples 5 and 6.

As the piezoelectric property of each piezoelectric ceramic (Examples 1 to 7 and Comparative Example 1 to 6) subjected to the polarization treatment, the mechanical quality factor (Qm), the vibration speed (m/s), and the resonance frequency variation (%) were measured. An impedance analyzer (manufactured by Agilent Technologies, 4294A) was used for the mechanical quality factor (Qm), and measurement was performed at a longitudinal vibration of around 400 kHz by a resonance-antiresonance method. Next, Qm was calculated by using an EMAS6000 series based on the measured value. The calculation result is shown in Table 3. The vibration speed and the resonance frequency variation were measured as follows.

Figure 4:
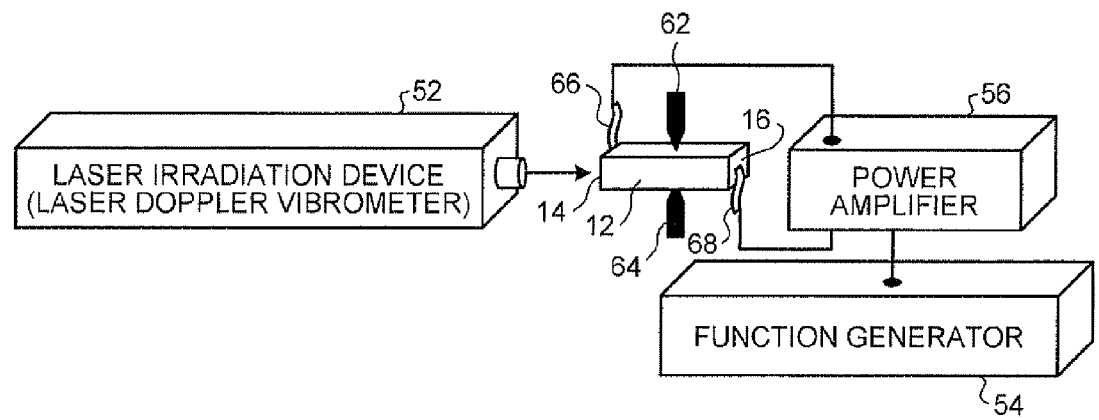
FIG. 4 is a schematic diagram illustrating the transducer and a measurement device used for evaluation of a vibration speed and a resonance frequency variation of the transducer.

FIG. 4 is a schematic diagram illustrating the transducer and a measurement device used for evaluation of the vibration speed and the resonance frequency variation of the transducer. The measurement device includes a laser irradiation device (LV-1710 manufactured by Ono Sokki Co., Ltd.) 52 that emits laser light to the piezoelectric ceramic 12 and incorporates a laser Doppler vibrometer that detects the vibration speed of the piezoelectric ceramic 12, and a function generator 54 (NF-WF-1943A) and a power amplifier 56 (NF-HAS-4052) for applying an alternating electric field to the piezoelectric ceramic 12. The piezoelectric ceramic 12 is held by a pair of upper and lower spring terminals 62 and 64, and aluminum foils 66 and 68 are adhered to the end portions of the pair of electrodes 14 and 16 provided to the opposing surfaces of the piezoelectric ceramic 12 in the longitudinal direction, respectively, by a conductive paste.

Various constant voltages and an alternating electric field around a resonance frequency were applied to the piezoelectric ceramic 12 by the function generator 54 and the power amplifier 56 and laser light was emitted to the center portion of the main electrode 14 from the laser irradiation device 52, and a vibration speed V of the piezoelectric ceramic 12 was measured by the laser Doppler vibrometer.

An alternating signal generated by the function generator 54 was subjected to a constant voltage sweep around the resonance frequency and a frequency with which the maximum vibration speed V was obtained was employed as the resonance frequency. Moreover, variation from the resonance frequency at a low amplification measured by the impedance analyzer was used as the variation of the resonance frequency. Table 3 shows both of the vibration speed (m/s) when the voltage of 5 V/mm was applied and the frequency variation (%) when the vibration speed was 2 m/s.

TABLE 3

| | Mechanical Quality Factor (Qm) | Vibration Speed (m/s) | Resonance Frequency Variation (%) |
|---|---|---|---|
| Example 1 | 4909 | 2.40 | −0.00686 |
| Example 2 | 4478 | 2.20 | −0.00175 |
| Example 3 | 4692 | 2.11 | −0.00312 |
| Example 4 | 4349 | 1.60 | −0.00139 |
| Example 5 | 3629 | 2.06 | −0.00344 |
| Example 6 | 4348 | 1.87 | −0.00409 |
| Example 7 | 3824 | 1.59 | −0.00611 |
| Comparative Example 1 | polarization treatment impossible | — | — |
| Comparative Example 2 | 2483 | — | — |
| Comparative Example 3 | 3190 | 1.53 | −0.00799 |
| Comparative Example 4 | 1975 | 1.02 | −0.01044 |
| Comparative Example 5 | polarization treatment impossible | — | — |
| Comparative Example 6 | 2540 | 0.88 | −0.00755 |

Result

Examples 1 to 5

As is apparent from Tables 1 to 3, in the transducers according to Examples 1 to 5 in which Mn was added at 0.2% by mass or more and 0.8% by mass or less by using $MnCO_3$, it is found that the mechanical quality factor (Qm) is sufficiently high, the vibration speed is approximately 2 m/s or more, and the resonance frequency variation is suppressed to less than −0.007%. Specially, in the transducer according to example 1 in which Mn was added at 0.2% by mass, the mechanical quality factor (Qm) showed a value of about 5000 and the vibration speed showed a high value (2.4 m/s).

Examples 6 and 7

In the transducers according to Examples 6 and 7 in which 20 mol % or 40 mol % of $SrBi_4Ti_4O_{15}$ was substituted with $BaBi_4Ti_4O_{15}$, in the similar manner to the transducer according to Example 1 in which the Mn content is the same and substitution by Ba is not performed, it is found that all of the evaluation items (mechanical quality factor, vibration speed, and resonance frequency variation) show excellent results.

Comparative Examples 1 and 2

On the other hand, in the transducer according to Comparative Example 1 in which only one of the main components in Examples 1 to 5, i.e., $Bi_4Ti_3O_{12}$ is used as the main component, a resistivity of the piezoelectric ceramic is low and current flows in the polarization treatment, so that the polarization treatment cannot be performed. Therefore, the vibration speed and the resonance frequency variation could not be measured. The transducer according to Comparative Example 2 in which only the other one of the main components in Examples 1 to 5, i.e., $SrBi_4Ti_4O_{15}$ is used as the main component showed a relatively large mechanical quality factor (about 2500); however, the density of the transducer is low and the vibration speed is extremely small, so that the vibration speed and the resonance frequency variation could not be accurately measured.

Comparative Examples 3 and 4

In the transducer according to Comparative Example 3 in which Mn is not included in the main components in Examples 1 to 5, the mechanical quality factor exceeds 3000, so that the effect of having both of the components in Comparative Examples 1 and 2 is proved with respect to Comparative Examples 1 and 2; however, it is found that the result equivalent to Examples 1 to 7 is not obtained for the vibration speed and the resonance frequency variation. In the transducer according to Comparative Example 4 in which the Mn additive amount in Examples 1 to 5 was changed to 1.0% by mass, it is found that the mechanical quality factor (Qm) becomes less than 2000, the vibration speed is lowered largely compared with Examples 1 to 5, and the resonance frequency variation becomes large.

Comparative Examples 5 and 6

Moreover, in the transducer according to Comparative Example 5 in which a $BaBi_4Ti_4O_{15}$ substitution amount in Examples 6 and 7 was changed to 60 mol %, the polarization treatment cannot be performed, so that the vibration speed and the resonance frequency variation could not be measured. In the transducer according to Comparative Example 6 in which a substitution substance $BaBi_4Ti_4O_{15}$ in Example 6 was changed to $CaBi_4Ti_4O_{15}$ in the same amount, it is found that an excellent result is not obtained for all of the evaluation items (mechanical quality factor, vibration speed, and resonance frequency variation) compared with the transducer according to Example 6 and there is no effect in using an oxide including Ca.

The piezoelectric composition of the embodiment includes no or little Pb and therefore is a composition that gives consideration to environmental problems, and the piezoelectric ceramic in which the composition is used exerts an excellent piezoelectric property and thus can suppress heat generation when driving. Moreover, the piezoelectric ceramic can be used as a component of a transducer, and an ultrasonic motor in which the transducer is used can produce a high output.

Although the invention has been described with respect to specific embodiments for a complete and clear disclosure, the appended claims are not to be thus limited but are to be construed as embodying all modifications and alternative constructions that may occur to one skilled in the art that fairly fall within the basic teaching herein set forth.

What is claimed is:

1. A piezoelectric composition comprising:
    a compound represented by a general expression $Bi_4Ti_3O_{12}$—$SrBi_4Ti_4O_{15}$ as a main component; and
    Mn or a Mn compound as an additive, wherein
    a Mn content is less than 1.0% by mass based on a main component amount.

2. The piezoelectric composition according to claim 1, wherein 40 mol % or less of the $SrBi_4Ti_4O_{15}$ is substituted with $BaBi_4Ti_4O_{15}$.

3. A piezoelectric ceramic which is manufactured by using the piezoelectric composition according to claim 1 and of which mechanical quality factor is 1000 or more.

4. A transducer comprising:
    the piezoelectric ceramic according to claim 3; and
    an electrode.

5. An ultrasonic motor comprising the transducer according to claim 4.

* * * * *